United States Patent
Schmid et al.

(10) Patent No.: US 7,208,823 B2
(45) Date of Patent: Apr. 24, 2007

(54) SEMICONDUCTOR ARRANGEMENT COMPRISING TRANSISTORS BASED ON ORGANIC SEMICONDUCTORS AND NON-VOLATILE READ-WRITE MEMORY CELLS

(75) Inventors: Gunter Schmid, Hemhofen (DE); Marcus Halik, Erlangen (DE); Hagen Klauk, Erlangen (DE)

(73) Assignee: Infineon Technologies AG, Munich (DE)

( * ) Notice: Subject to any disclaimer, the term of this patent is extended or adjusted under 35 U.S.C. 154(b) by 71 days.

(21) Appl. No.: 10/495,614

(22) PCT Filed: Nov. 15, 2002

(86) PCT No.: PCT/DE02/04235

§ 371 (c)(1),
(2), (4) Date: Nov. 15, 2004

(87) PCT Pub. No.: WO03/046922

PCT Pub. Date: Jun. 5, 2003

(65) Prior Publication Data

US 2005/0077606 A1    Apr. 14, 2005

(30) Foreign Application Priority Data

Nov. 16, 2001    (DE) ................................. 101 56 470

(51) Int. Cl.
*H01L 23/02*    (2006.01)
(52) U.S. Cl. ................. 257/679; 257/40; 257/E51.027; 257/E23.064; 257/E23.176
(58) Field of Classification Search ................ 257/679, 257/40, E23.001, E23.018, E23.064, E23.065, 257/E23.176, E23.177, E51.027
See application file for complete search history.

(56) References Cited

U.S. PATENT DOCUMENTS

| | | | |
|---|---|---|---|
| 5,206,525 A | 4/1993 | Yamamoto et al. | 257/40 |
| 5,608,246 A | 3/1997 | Yeager et al. | 257/295 |
| 5,858,843 A * | 1/1999 | Doyle et al. | 438/299 |
| 5,883,397 A * | 3/1999 | Isoda et al. | 257/40 |
| 5,981,970 A | 11/1999 | Dimitrakopoulos | 257/40 |
| 6,497,992 B1 * | 12/2002 | Yunogami et al. | 430/313 |
| 6,646,903 B2 * | 11/2003 | Chow | 365/145 |
| 6,774,578 B2 * | 8/2004 | Tanada | 315/169.4 |
| 6,818,920 B2 * | 11/2004 | De Leeuw et al. | 257/48 |
| 7,025,277 B2 * | 4/2006 | Forrest et al. | 235/492 |
| 2005/0032226 A1 * | 2/2005 | Natan | 436/56 |

FOREIGN PATENT DOCUMENTS

| | | |
|---|---|---|
| DE | 39 22 423 C2 | 1/1990 |
| DE | WO 92/12518 | 7/1992 |
| DE | 199 35 527 A1 | 2/2001 |
| DE | 100 12 204 | 9/2001 |
| DE | WO 01/73845 A1 | 10/2001 |
| EP | 1 103 916 A1 | 5/2001 |
| KR | 1998-024743 | 7/1998 |
| WO | WO 98/14989 | 4/1998 |
| WO | WO 98/58383 | 12/1998 |
| WO | WO 02/43071 A1 | 5/2002 |

OTHER PUBLICATIONS

JP 61-105 792 A -English language Abstract.
Article entitled "Low-Voltage High Mobility Pentacene Transistors with Solution-Processed High Dielectric Constant Insulators" by Dimitrakopoulos et al. published in Journal of Adv. Mater, 1999, 11, No. 16, pp. 1372-1375.
Article entitled "Low-Voltage Organic Transistors on Plastic Comprising High-Dielectric Constant Gate Insulators" by Dimitrakopoulos et al., published in Science Magazine, Feb. 5, 1999 vol. 283, pp. 822-824.
Article entitled "Organic Smart Pixels" by Dodabalapur et al., published in Journal of American Institute of Physics, Applied Physics Letters, vol. 73, No. 2, Jul. 13, 1998, pp. 142-144.
Article entitled "A Metal-Insulator-Semiconductor (MIS) Device Using A Ferroelectric Polymer Thin Film in the Gate Insulator" by Yamauchi, Noriyoshi published in the Japanese Journal of Applied Physics, vol. 25, No. 4, Apr. 1986, pp. 590-594.
Article entitled "Low-Cost-All-Polymer Integrated Circuits" by C.J. Drury et al., published in Journal of American Institute of Physics, Applied Physics Letters, vol. 73, No. 1, Jul. 6, 1998, pp. 108-110.
German Office Action Dated Jan. 31, 2003.
International Search Report May 28, 2003.
Velu, G., et al., "Low Driving Voltages and Memory Effect in Organic Thin-Film Transistors with a Ferroelectric Gate Insulator," Applied Physics Letters, vol. 79, No. 5, Jul. 30, 2001, American Institute of Physics, pp. 659-661.

* cited by examiner

*Primary Examiner*—Evan Pert
*Assistant Examiner*—Victor A. Mandala, Jr.
(74) *Attorney, Agent, or Firm*—Slater & Matsil, L.L.P.

(57) ABSTRACT

A semiconductor arrangement is disclosed, having transistors based on organic semiconductors and non-volatile read/write memory cells. The invention relates to a semiconductor arrangement, constructed from transistors, in the case of which the semiconductor path is composed of an organic semiconductor, and memory cells based on a ferroelectric effect perferably in a polymer, for use in RF-ID tags, for example.

19 Claims, No Drawings

SEMICONDUCTOR ARRANGEMENT COMPRISING TRANSISTORS BASED ON ORGANIC SEMICONDUCTORS AND NON-VOLATILE READ-WRITE MEMORY CELLS

BACKGROUND

1. Field

The following relates to a semiconductor arrangement having at least one semiconductor device having a semiconductor path made of an organic semiconductor.

2. Background Information

Transponder technology uses contactless reading from or writing to a memory with a transmitter/receiver unit. The memory is part of a memory unit fixed, for example, to an object about which specific information is stored in the memory. Usually, the circuit comprising the memory does not have a dedicated power supply, but rather, is supplied via an alternating electromagnetic field by means of which the integrated circuit at the same time communicates with the transmitter/receiver unit. To that end, carrier frequencies of 125 kHz and 13.56 MHz are customarily used. This technology is used for example for finding and identifying pipelines that are buried in the ground and are therefore inaccessible, for identifying animals in large herds, or else in access cards which enable their owners for example to access specific access-restricted areas.

The microchips used in such systems are based on silicon as semiconductor material. Therefore, despite the advanced fabrication methods, the fabrication of the memory unit which can be read from and, if appropriate, written to with a transmitter/receiver is still comparatively complicated and expensive. In the case of the areas of use mentioned above, these costs are not significant since the memory unit usually remains on the object over a relatively long time or is used for high-priced goods. However, there are a host of conceivable fields of application for transponder technology in which, although only a small amount of information has to be processed, on the other hand a severe cost pressure prevails, that is to say the memory units used heretofore are ruled out for cost reasons for application in everyday practice.

A considerable cost reduction and time saving could be achieved for example by use of RF-ID tags (Radio Frequency Identification Tags) in the retail trade. Thus, by way of example, the merchandise can be provided with RF-ID tags on which information concerning the merchandise is stored. This information may be, for example, the price, the use by date or else the end store in which the merchandise is to be sold to the customer. If it is also possible to write information to the RF-ID tag, the manufacturer can already provide the merchandise with all the necessary information, e.g. the price and the end store allocated to the merchandise, on the basis of an electronically incoming order. This enables the logistics to be simplified further since the merchandise can e.g. be manufactured in an automated fashion and be allocated to an end store. In the end store, savings can be realized in the cash desk area, for example. When passing a cash desk, the information concerning the merchandise is transmitted contactlessly to the cash desk. The cash desk determines the price, automatically creates an invoice and balances the merchandise stock. In conjunction with a cashless electronic payment transaction, any loss of time in the cash desk area for customers is obviated. At the same time, the requirement for new merchandise can be electronically reported automatically to the manufacturer.

In order to be able to implement such sales systems competitively in practice, the price of an RF-ID tag for the applications described above must not exceed that of a conventional bar code tag. In other words, the production costs must be in the region of fractions of cents. This results in the requirement that the RF-ID tags can be produced in a short time and in large quantities. Furthermore, the tag must have properties such as a high robustness, or a low weight, in order to be able to be processed without difficulty, or else a high degree of flexibility, in order to be able to be fixed even on curved areas such as the surface of a bottle. Although silicon chips can be fabricated in very small layer thicknesses, so that they become flexible, these methods are likewise very complicated and expensive, with the result that they are ruled out for the applications described. On the other hand, however, the requirements made of the RF-ID tag with regard to storage quantity and storage density are comparatively minor for the applications described above.

SUMMARY

Therefore, a device is disclosed that, in a very simple manner and extremely inexpensively relative to conventional solutions, an item of information of limited extent can be stored and read out at least for a time duration delimited by months. This can be achieved by means of a semiconductor arrangement which comprises at least one semiconductor device having a semiconductor path made of at least one organic semiconductor, and which has at least one rewritable memory cell based on a ferroelectric effect in a memory material.

A solution according to an embodiment of the invention on the one hand utilizes organic semiconductor technology, which makes it possible to fabricate integrated circuits in an extremely cost-effective manner, e.g. with the aid of printing techniques. Although at the present time organic semiconductor technology does not yet allow an integration density as high as that possible with silicon semiconductor technology, this integration density is not actually necessary for the applications described above since only small amounts of information have to be processed and a comparatively large area is available for the circuit arrangement, e.g. on the rear side of a bottle tag. The organic semiconductor technology is combined with a memory medium based on a ferroelectric effect. Once the required information has been written to the memory, a further voltage supply is not required for preserving the information. The memory medium based on a ferroelectric effect maintains the information even over the time periods required for the applications described above, that is to say for example a time period between when the memory is written to by the manufacturer of the merchandise and the information is read out at the cash desk of the end store.

Further advantages, features and details of the invention emerge from the exemplary embodiments described below.

DETAILED DESCRIPTION

Organic semiconductors have charge carrier mobilities in the range of approximately 0.1–1 cm2/Vs. This allows the construction of all the components and circuits required for RF-ID systems with semiconductor devices based on organic semiconductors.

The combination of organic semiconductor technology with suitable memory materials thus creates an arrangement which can store information and at the same time is composed in its entirety of materials which can be processed in a very simple manner, for example also with cost-effective bench units, at normal ambient temperatures.

The information to be stored can be written to and read from the memory contactlessly. Information is communicated from and to the memory in principle in the same way. If the semiconductor arrangement according to the invention is contained in a tag, for example, a programming can also advantageously be performed only after the tag has been applied to an object to be identified. Thus, by way of example, an item of merchandise can already be assigned to a specific end store at the end of the production line in an up-to-date manner with respect to the incoming orders and hence the further sales route can be determined with the highest possible up-to-date relevance, without this necessitating e.g. storage of a large amount of stock.

Since the memory cells are based on a ferroelectric effect, the memory cells may preferably be designed as read/write memories. The stored information can then be altered and updated at any time.

Memory materials suitable for the semiconductor arrangement according to the invention are those in which a ferroelectric effect is sufficiently distinctly pronounced to be able to detect two different polarization states without a high outlay.

An organic polymer having ferroelectric properties is particularly preferably used as memory material. Ferroelectric polymers can be processed by the simple and cost-effective methods which are customarily used in organic semiconductor technology, and can be applied to a substrate for example likewise by printing methods. Particularly on flexible substrates, these materials prove to be robust against bending and twisting of the substrate. The inertia with which the polarization of the ferroelectric polymer follows the programming voltage is generally sufficiently low for the applications sought.

The ferroelectric effect necessary for the memory cell is largely independent of the material used for the electrodes by which the programming voltage is communicated to the ferroelectric polymer. The use of ferroelectric organic polymers as memory medium of a memory cell therefore imposes hardly any restriction on the choice of material for the electrodes.

To date, all investigations on the ferroelectric behaviour of polymers have been carried out on simple, usually isolated layer systems. A memory cell based on a ferroelectric effect in conjunction with a control and addressing circuit embodied with transistors having a semiconductor path made of an organic semiconductor has not been demonstrated heretofore.

In a preferred group of ferroelectric polymers, the electrical conductivity of the polymer is influenced by the polarization state. The two states of the conductivity can be utilized to define a binary data content of a memory cell. Examples of such organic polymers having ferroelectric properties are fluorinated polyenes.

As was able to be shown by A. Bune, S, Ducharme, V. Fridkin, L. Blinov, S. Palto, N. Petukhova, S. Yudin, "Novel Switching Phenomena in Ferroelectric Langmuir-Blodgett Films", Appl. Phys. Lett. 67 (26), (1995) and A. Bune, S. Ducharme, V. Fridkin, L. Blinov, S. Palto, A. V. Sorokin, S. Yudin, A. Zlatkin, "Two-dimensional Ferroelectric Films", Nature Vol. 391 (1998), the two polarization states can differ in terms of their conductivity by a factor in the region of 100. This makes it possible to reliably distinguish between the two states of the conductivity and thus to reliably read out the information contained in the memory.

A changeover of the polarization and thus a change in the conductivity of the polymer is achieved by changing over the polarity of a programming voltage which generates an electric field in the polymer. After the programming voltage has decayed, the conductivity state previously set by the programming voltage is maintained. The conductivity of the polymer changes its state only through application of a programming voltage (coercive voltage) which has opposite polarity with respect to the first programming voltage and generates in the polymer an electric field whose magnitude is greater than the coercive field strength of the polymer.

Preferably, however, the stored information is read out by measurement of a charge, or a quantity derived therefrom, which is required to effect polarization reversal of the ferroelectric. This charge is dependent on the prepolarization of the ferroelectric. This means that the read operation is effected destructively. Thus, all the memory cells or ferrocapacitors have the same polarization after the information has been read out. If the information is to be maintained, the memory content must be written back to the ferrocapacitor again after the read operation. This can be done directly after the read operation or else at a later time. To that end, it is possible to buffer-store the memory content, for example in a normal capacitor memory or a flip-flop, or two ferroelectric memory areas are used alternately. This is particularly advantageous in the RF-ID case, in which the information is read out contactlessly, since the information is not lost in the case of a voltage drop.

Among the fluorinated polyenes, in particular those based on PVDF (polyvinylidenedifluoride) and here again in particular the copolymer with trifluoroethylene (PVDF-PTrFE; 70:30) prove to be particularly suitable. Further suitable polyenes are described for example in T. T. Wang, J. M. Herbst, A. M. Glass, "The Applications of Ferroelectric Polymers", ISBN 0-412-01261-8.

The inertia with which the polarization follows the programming voltage, with 10–100 ms for PVDF polymers, is sufficiently low for the applications sought.

PVDF polymers are robust against bending and twisting and are therefore also suitable for application to flexible substrates.

As an alternative to the above-described organic polymers having ferroelectric properties, it is also possible to use inorganic ferroelectrics as memory material. One class of suitable ferroelectric inorganic materials which can be used as memory materials are ferroelectric tantalates and titanates, such as strontium bismuth tantalate (SBT) or lead zirconium titanates (PZT, $PbZr_xTi_{1-x}O_3$).

An integration of active semiconductor devices and memory cells made of materials which can be provided in identical or similar production processes on identical installations, that is to say with the processes and auxiliary means of organic semiconductor technology that are simple and cost-effective relative to silicon technology, extends the spectrum of application for integrated circuits.

In a particularly preferred embodiment of the invention, the semiconductor arrangement has semiconductor devices which functionally supplement the semiconductor arrangement to form an RF-ID tag.

Preferably, semiconductor arrangements having organic active semiconductor devices and memory cells are applied on flexible substrates. If the active and passive semiconductor devices, memory cells and interconnects which are constructed in thin layers on the substrate are also constructed from flexible, robust materials, a mechanical construction results which, for its part, can easily be applied to curved surfaces.

What are suitable as substrate are flexible films made of metals and metal alloys, such as copper, nickel, gold and iron alloys, made of celluloses, such as paper, and also made of plastics such as polystyrene, polyethylene, polyurethanes, polycarbonates, polyacrylates, polyimides, polyethers and polybenzoxazoles. The size and the area requirement of a memory cell are non-critical in the case of cost-effective substrates, for instance paper. Since essential properties of the memory cell can be influenced by way of the area of the memory cell, an additional degree of freedom for the design of the memory cell is obtained by resulting to cost-effective substrates.

What are suitable as material for the semiconductor path in the semiconductor devices based on organic semiconductors are preferably p-type semiconductors based on condensed aromatics, such as anthrazene, tetrazene, pentazene, polythiophenes, such as poly-3-alkylthiophenes, polyvinylthiophene, and polypyrroles. Furthermore, organometallic complexes of phthalocyanine or of porphyrin can be used. The semiconductor device used in the semiconductor arrangement according to the invention is an organic transistor, for example, in particular an organic field-effect transistor, by means of which, for example, the memory cell can be switched between two states. In this case, the semiconductor path is the layer—arranged between source and drain electrodes—of an organic semiconductor whose electrical conductivity is controlled by the field of a gate electrode.

The semiconductor arrangement itself and/or the active and passive semiconductor devices (field-effect transistors, capacitors) based on organic semiconductors have insulator layers made of a dielectric, in a manner governed by the function. Both inorganic and organic dielectrics are appropriate in this case. Dielectrics whose stability and robustness make them suitable in particular for arrangements on substrates are, for instance, silicon dioxide and silicon nitride. Both materials can be integrated in semiconductor arrangements of the type according to the invention, as in M. G. Kane, H. Klauk et al; "Analog and Digital Circuits Using Organic Thin-Film Transistors on Polyester Substrates" IEEE Electron Device Letters Vol. 21 No. 11 534 (2000) and D. J. Gundlach, H. Klauk et al. "High☐Mobility, Low Voltage Organic Thin Film Transistors" International Electron Devices Meeting, December (1999).

Moreover, in particular polystyrene, polyethylene, polyester, polyurethane, polycarbonate, polyacrylate, polyimide, polyether, and polybenzoxazol are suitable owing to the possibility of being deposited by means of simple printing methods.

For the shaping of interconnects of the semiconductor arrangement and the electrodes in the semiconductor devices, for cost-critical applications it is possible to provide doped organic semiconductors, such as polyanaline doped with camphorsulphonic acid or polythiaphines doped with polystyrenesulphonic acid, which can be deposited by means of simple and cost-effective printing methods. If lower power losses are sought in the interconnects, then metals or metal alloys with low resistivity are preferred, that is to say for instance palladium, gold, platinum, nickel, copper, titanium and aluminium.

The electric field strengths or programming voltages required for changing over the polarization lie in a range which overlaps an operating range of transistors based on organic semiconductors.

A required signal swing for write and read voltages is scaleable by way of the area of the memory cell and can thus be adapted to the properties of addressing and control transistors.

In a first embodiment of the invention, the memory cells in a memory are addressed by selection transistors. This type of addressing makes it possible to realize a fast, specific and interference-immune access to the memory cell.

According to a second embodiment, the addressing is effected by means of a passive matrix, as is described e.g. in the patent U.S. Pat. No. 6,055,180. With this type of addressing, the selection transistor otherwise assigned to each memory cell is obviated. This leads to a particularly simple construction of a memory.

According to a third embodiment, selective addressing of individual memory cells is not effected. Instead, serial storage in a shift register is effected. Dispensing with selective addressing again results in a simplified memory structure.

The semiconductor arrangement according to the invention can be fabricated from comparatively easily accessible materials with the aid of cost-effective methods, for example printing techniques. Therefore, the semiconductor arrangement according to the invention is particularly suitable for applications in which information is stored cost-effectively over a time period of up to a plurality of months. Therefore, the invention also relates to a tag, comprising a substrate, a fixing layer and at least one semiconductor arrangement, as has been described above, which semiconductor arrangement is provided on the substrate. In this case, examples of a suitable substrate are paper or a thin flexible plastic film on one side of which the semiconductor arrangement according to the invention is applied, for example by being printed on. On the semiconductor arrangement according to the invention, it is then possible to apply, if appropriate separated by a protective layer, an adhesive layer as fixing layer, with the aid of which the tag is fixed on an object. In this case, the semiconductor arrangement according to the invention is shielded against mechanical influences which might bring about destruction. Examples of fields of application for tags of this type are the tags for marking merchandise as already mentioned in the introduction or, for example, also electronic stamps whose value is stored on the stamp in the course of the sale. In an advantageous manner, the memory content in the case of these tags is read out destructively, i.e. the memory content is no longer written back after the read-out. In this way, stamps, for example, can be invalidated at the same time as their value is read out.

A further field of application for the semiconductor arrangement according to the invention is smart cards, comprising a substrate and at least one semiconductor arrangement, as has been described above, which semiconductor arrangement is provided on the substrate. Smart cards of this type have independent transaction capability and can be used for example as telephone cards or discount cards. In the case of telephone cards, a specific value is stored upon purchase and is then progressively devalued by the read-out operation during use. In this case, what is suitably used as substrate is a material which has a higher mechanical strength than is necessary in the case of the above-described tag. By way of example, a substrate made of cardboard or a plastic laminate is suitable. The semiconductor arrangement according to the invention is then suitably embedded between two paper or plastic layers in order to protect it from mechanical influences. As an alternative, protection by a varnish layer is also conceivable. Although the smart card described is suitable in particular for applications, which are subject to a very severe cost pressure and in which only a limited period of use is required, an embodiment which enables use over longer periods of time, for example as a bank card, credit card or medical insurance card, is nonetheless also possible.

The above-described tag and the above-described smart card are preferably configured in such a way that the stored information can be written in or read out contactlessly. However, an embodiment is also possible in which provision is made of a contact for writing and reading from the memory, which is contact-connected to a corresponding contact of a read/write device for the purpose of writing/reading.

The foregoing desclosure of embodiments of the present invention has been presented for purposes of illustration and description. It is not intended to be exhaustive or to limit the invention to the precise forms disclosed. Many variations and modifications of the embodiments described herein will be obvious to one of ordinary skill in the art in light of the above disclosure. The scope of the invention is to be defined only by the claims appended hereto, and by their equivalents.

The invention claimed is:

1. A semiconductor arrangement that can be used in a smart card or in a tag and is applied to a flexible substrate, comprising:
   at least one re-writeable memory cell;
   at least one semiconductor device having a semiconductor path made of at least one organic semiconductor,
   wherein the re-writeable memory cell is based on a ferroelectric effect in a memory material; and
   circuitry for contactless reading from and writing to said at least one memory cell.

2. The semiconductor arrangement as in claim 1, wherein the memory material is an organic polymer having ferroelectric properties.

3. The semiconductor arrangement as in claim 1, wherein the memory material is an inorganic material having ferroelectric properties.

4. The semiconductor arrangement as in claim 1, wherein a coercive voltage of the memory cell is adapted to an operating range of the semiconductor devices.

5. The semiconductor arrangement as in claim 1, wherein the memory cells are configured to form a shift register.

6. The semiconductor arrangement as in claim 1, wherein the semiconductor arrangement is configures such that an operation of reading an information item stored in the memory cell is effected destructively.

7. The semiconductor arrangement of claim 6 wherein the information item effected destructively by reading is then rewritten into the memory cell.

8. A semiconductor arrangement that can be used in a smart card or in a tag and is applied to a flexible substrate, comprising:
   at least one re-writeable memory cell;
   at least one semiconductor device having a semiconductor path made of at least one organic semiconductor,
   wherein the re-writeable memory cell is based on a ferroelectric effect in a memory material; and
   wherein passive and active semiconductor devices having semiconductor paths made of organic semiconductors, interconnects and insulator layers supplement the semiconductor arrangement to form an RF-ID tag.

9. A semiconductor arrangement that can be used in a smart card or in a tag and is applied to a flexible substrate, comprising:
   at least one re-writeable memory cell;
   at least one semiconductor device having a semiconductor path made of at least one organic semiconductor,
   wherein the re-writeable memory cell is based on a ferroelectric effect in a memory material; and
   organic selection transistors for addressing the memory cells.

10. A semiconductor arrangement that can be used in a smart card or in a tag and is applied to a flexible substrate, comprising:
    at least one re-writeable memory cell;
    at least one semiconductor device having a semiconductor path made of at least one organic semiconductor,
    wherein the re-writeable memory cell is based on a ferroelectric effect in a memory material; and
    a passive matrix for addressing the memory cells.

11. A semiconductor arrangement that can be used in a smart card or in a tag and is applied to a flexible substrate, comprising:
    a paper or cardboard substrate;
    at least one re-writeable memory cell; and
    at least one semiconductor device having a semiconductor path made of at least one organic semiconductor,
    wherein the re-writeable memory cell is based on a ferroelectric effect in a memory material.

12. A semiconductor read/write memory structure for use in a smart card or in a tag and suitable for applying to a flexible substrate, comprising:
    at least one memory cell capable of multiple read/write cycles, said memory cell made of an organic polymer memory material having ferroelectric effects defining two polarization states;
    at least one semiconductor device having a semiconductor path made of at least one organic semiconductor; and
    circuitry for contactless reading from and writing to said at least one memory cell.

13. The semiconductor read/write memory structure as in claim 12, wherein the semiconductor arrangement is configured such that an operation of reading an information item stored in the memory cell is effected destructively.

14. The semiconductor read/write memory structure of claim 13 wherein the information item effected destructively by reading is then rewritten into the memory cell.

15. The semiconductor read/write memory structure as in claim 12, wherein a coercive voltage of the memory cell is adapted to an operating range of the semiconductor devices.

16. A semiconductor read/write memory structure for use in a smart card or in a tag and suitable for applying to a flexible substrate, comprising:
    at least one memory cell capable of multiple read/write cycles, said memory cell made of an organic polymer memory material having ferroelectric effects defining two polarization states;
    at least one semiconductor device having a semiconductor path made of at least one organic semiconductor; and
    organic selection transistors for addressing the memory cells.

17. A semiconductor read/write memory structure for use in a smart card or in a tag and suitable for applying to a flexible substrate, comprising:
    at least one memory cell capable of multiple read/write cycles, said memory cell made of an organic polymer memory material having ferroelectric effects defining two polarization states;
    at least one semiconductor device having a semiconductor path made of at least one organic semiconductor; and
    a passive matrix for addressing the memory cells.

18. A semiconductor read/write memory structure for use in a smart card or in a tag and suitable for applying to a flexible substrate, comprising:

at least one memory cell capable of multiple read/write cycles, said memory cell made of an organic polymer memory material having ferroelectric effects defining two polarization states;

at least one semiconductor device having a semiconductor path made of at least one organic semiconductor; and said memory cells configured to form a shift register.

19. A semiconductor read/write memory structure for use in a smart card or in a tag and suitable for applying to a flexible substrate, comprising:

at least one memory cell capable of multiple read/write cycles, said memory cell made of an organic polymer memory material having ferroelectric effects defining two polarization states;

at least one semiconductor device having a semiconductor path made of at least one organic semiconductor; and wherein passive and active semiconductor devices having semiconductor paths made of organic semiconductors, interconnects and insulator layers supplement the semiconductor arrangement to form an RF-ID tag.

\* \* \* \* \*